United States Patent
Yu et al.

(10) Patent No.: US 6,888,901 B2
(45) Date of Patent: May 3, 2005

(54) APPARATUS AND METHOD FOR STOPPING ITERATIVE DECODING IN A CDMA MOBILE COMMUNICATION SYSTEM

(75) Inventors: Nam-Yul Yu, Seoul (KR); Min-Goo Kim, Suwon-shi (KR); Soon-Jae Choi, Songnam-shi (KR); Beong-Jo Kim, Songnam-shi (KR); Young-Hwan Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 585 days.

(21) Appl. No.: 10/027,395

(22) Filed: Dec. 20, 2001

(65) Prior Publication Data

US 2003/0066018 A1 Apr. 3, 2003

(30) Foreign Application Priority Data

Dec. 23, 2000 (KR) ........................................ 2000-81387

(51) Int. Cl.[7] .......................... H03L 27/06; H03M 13/03
(52) U.S. Cl. ........................ 375/341; 375/262; 714/794
(58) Field of Search ................................. 375/341, 262, 375/316; 714/794, 795, 798, 791, 792

(56) References Cited

U.S. PATENT DOCUMENTS

| 6,745,352 B1 | * | 6/2004 | Cheng | ........................ 714/704 |
| 6,829,313 B1 | * | 12/2004 | Xu | ............................. 375/341 |
| 2002/0013922 A1 | | 1/2002 | Gueguen | |
| 2002/0061079 A1 | * | 5/2002 | Bass | ........................ 375/341 |
| 2004/0153940 A1 | * | 8/2004 | Yu et al. | ..................... 714/746 |

FOREIGN PATENT DOCUMENTS

| EP | 1 128 589 | 8/2001 |
| JP | 2000-216689 | 8/2000 |
| JP | 2002-158633 | 5/2002 |
| WO | WO 00/27037 | 5/2000 |

OTHER PUBLICATIONS

Japanese Office Action dated Jul. 1, 2003 issued in a counterpart application, namely Appln. No. 2002–553314.
European Search Report dated Jul. 15, 2003 issued in Application No. 01130922.6.
Zhai et al., "New Error Detection Techniques and Stopping Criteria for Turbo Decoding", Canadian Conference on Electrical and Computer Engineering Proceedings, vol. 1, Mar. 7–10, 2000, pp. 58–62.

* cited by examiner

*Primary Examiner*—Khai Tran
(74) *Attorney, Agent, or Firm*—Dilworth & Barrese, LLP

(57) ABSTRACT

Disclosed is an apparatus for stopping iterative decoding in a turbo decoder performing iterative decoding on a received frame comprised of information bits and then outputting the iteratively decoded results. A turbo decoder sequentially outputs absolute LLR (Log Likelihood Ratio) values associated with the respective information bits of the received frame by the iterative decoding, and stops the iterative decoding in response to a stop command for the iterative decoding. A minimum LLR detector selects a minimum value M(i) among the sequentially output absolute LLR values. A controller issues a command to stop the iterative decoding, if the minimum value M(i) is larger than a first threshold determined based on a minimum value $F_{min}$ among absolute LLR values output through previous iterative decoding.

35 Claims, 8 Drawing Sheets

APPARATUS AND METHOD FOR STOPPING ITERATIVE DECODING IN A CDMA MOBILE COMMUNICATION SYSTEM

PRIORITY

This application claims priority to an application entitled "Apparatus and Method for Stopping Iterative Decoding in a CDMA Mobile Communication System" filed in the Korean Industrial Property Office on Dec. 23, 2000 and assigned Serial No. 2000-81387, the contents of which are hereby incorporated by reference.

BACKGROUND OF THE INVENTION

1. Field of the Invention

The present invention relates generally to an apparatus and method for stopping iterative decoding in a CDMA (Code Division Multiple Access) mobile communication system, and in particular, to an apparatus and method for stopping iterative decoding caused by an occurrence of an error.

2. Description of the Related Art

In general, a CDMA mobile communication system refers to a mobile communication system that performs radio communication by adopting the CDMA technique. Such a mobile communication system performs forward error correction (FEC) in order to correct errors caused by the noises generated in transport channels. For the forward error correction, the CDMA mobile communication system typically uses a convolutional code or a turbo code.

In particular, the turbo code has been adopted as an error correction code in both a synchronous 3GPP2 ($3^{rd}$ Generation Partnership Project 2) system and an asynchronous 3GPP ($3^{rd}$ Generation Partnership Project) system, both recently attracting attention as a $3^{rd}$ generation mobile communication system. It is well known that the turbo code is superior in performance to the existing convolutional code, especially during high-speed data transmission. In addition, the turbo code, a kind of the FEC code, is advantageous in that it can increase a reliability of transmission data by effectually correcting an error caused by the noises generated in the transport channels.

An existing convolutional encoder, however, outputs decoded data after performing decoding once on each input frame. In contrast, a turbo encoder generally uses an iterative decoding scheme for outputting decoded data after performing decoding several times on each input frame.

It is very important for the iterative decoding scheme to determine the time for stopping the decoding. In order to reduce a decoding time and minimize power consumption for the decoding, the iterative decoding scheme must frequently check an occurrence of the error for a decoding frame. For this purpose, a turbo code including a CRC (Cyclic Redundancy Check) bit is generally used.

In the CRC-based iterative decoding, a transmitter adds CRC bits to each input frame received at a turbo encoder, and a receiver then performs error detection using the CRC bits on a frame output in every iterative decoding process (or at every iteration). If no error has occurred in the frame in the error detection process, the receiver stops the decoding on the frame.

The CRC-based error detection can detect almost all errors by increasing the number of the CRC bits, thus making it possible to minimize an increase in a frame error rate (FER) due to the stop of the decoding. However, when applied to the actual system, the CRC-based error detection has several problems. A detailed description of the problems will be given below.

First, the 3GPP system reduces unnecessary iterations (or iterative decoding processes) by checking a frame error at every iteration at the receiver, and also inserts a CRC bit in each transport block in order to measure reliability of the decoded data at the receiver. However, when the CRC bit is inserted in each transport block, the transmitter concatenates transport blocks on its transport channel and segments the concatenated transport block into code blocks, so that the CRC bits may be separated from their associated transport blocks during encoding. This problem will be described in detail with reference to FIGS. 1 and 2. FIG. 1 is a block diagram illustrating a channel multiplexing process and a channel coding process used in the 3GPP downlink. FIG. 2 illustrates an exemplary method for segmenting a concatenated transport block into code blocks for encoding.

The CRC-related parts of FIGS. 1 and 2 will be described herein below. As illustrated in FIG. 2, the concatenated transport block is segmented into code blocks. As a result, the CRC bit may be separated from its associated transport block as stated above, in the code block segmentation process. Therefore, in the case of a non-CRC code block, the CRC can no longer be used as a stopping criterion in the iterative decoding process.

In FIGS. 1 and 2 where the 3GPP system uses the turbo code as an error correction code, if the size (or length) $X_i$ of a concatenated transport block of an $i^{th}$ transport channel is larger than 5114 bits, the concatenated transport block is segmented into $C_i = \lceil X_i/5114 \rceil$ code blocks. Here, the size $K_i$ of each code block is $K_i = \lceil X_i/C_i \rceil$ bits, and for the insufficient bits, 0-value are inserted in the starting portion bits of the first code block. The code blocks created in this way are transmitted over the transport channel after performing their turbo encoding process. The receiver then performs turbo decoding on the received code blocks. The turbo decoding is performed in a unit of the code block determined by the transmitter. Therefore, as illustrated in FIG. 2, the CRC bits added to the rear of the transport block may be separated from their transport blocks in the code block segmentation process. In the case of the non-CRC code blocks, the CRC bits can no longer be used as a criterion for stopping the decoding in the turbo decoding process. Therefore, the existing 3GPP system using the CRC as a stopping criterion for the turbo decoding has the above problem.

Second, in the existing 3GPP system using the CRC as a criterion for stopping the turbo decoding, when the code block, i.e., a frame input to the turbo decoder, is small in size, the CRC bits used in each frame effect overload during data transmission, thus reducing transmission efficiency. For example, if the size of the input frame received per second is N and the total number of the CRC bits in use is C, then the actual data transmission efficiency becomes N/(N+C). Therefore, if the C is not greatly smaller than N, the transmission efficiency will be reduced to far below 1.0.

Third, in the case of the existing 3GPP or 3GPP2 system using the CRC as a criterion for stopping the turbo decoding, if the turbo decoder mis-recognizes an erroneous codeword as an error-corrected codeword due to excessive errors generated in the transport channel (this state is called "undetectable error event"), then the CRC will continuously indicate error detection at every iteration (or in every iterative decoding process). Therefore, the turbo decoder continuously iterates the decoding as many times as the maximum iteration number, and even after the iterations, outputs an erroneous codeword. In this case, it is preferable to stop the decoding by detecting the "undetectable error event" before the decoding is iterated as many times as the maximum iteration number. However, it is not possible to detect the "undetectable error event" by simply using only the CRC bits. Further, in this case, the turbo decoder must iterate the decoding as many times as the maximum iteration number, thus increasing the power consumption and the decoding time.

In order to solve the above problems, research has been made into a method of stopping iteration of the decoding on the turbo code without using the CRC. For example, the proposed method is to use the minimum absolute value of log likelihood ratio (LLR) values, which are output from the turbo decoder at every iteration in the iterative decoding process for the turbo code. That is, this method stops the decoding if the minimum value of absolute LLR values output at every iteration is higher than a threshold. This method shows relatively excellent FER performance and reduces an average decoding iteration number, thus contributing to a decrease in the power consumption. In addition, it is very easy to realize the method by hardware. However, in the above-stated method, the threshold for guaranteeing the excellent FER performance depends upon Eb/No and the frame size. Accordingly, the threshold must be sensitively changed in response to a change in the values (of Eb/No and the frame size). Particularly, in the actual system having difficulty in accurately measuring Eb/No of a received signal, it is very difficult to accurately estimate a change in the values, caused by a change in the transmission environment, and thus, the method using the minimum value of absolute LLR values with existing threshold is also not proper to be used as stopping criteria for the iterative decoding.

The problems, which may occur in the error correction method using the turbo code, will be summarized below.

First, the problems, which may occur in the method for stopping the turbo decoding using the CRC, are as follows.

(1) In the 3GPP system, the CRC bits for the transport blocks can be separated from their associated transport blocks in the code block segmentation process, so that the CRC can no longer be used as a criterion for error detection.

(2) If the frame input to the turbo encoder is small in size (i.e., if the transport block is small in size in the 3GPP system), the CRC bits used in each input frame may become overload, causing a transmission rate loss.

(3) When the turbo decoder mis-recognizes an erroneous codeword as an error-corrected codeword due to excessive errors generated in the transport channel, the CRC will continuously indicate error detection at every iteration. Therefore, the turbo decoder continuously iterates the decoding as many times as the maximum iteration number, and even after the iterations, outputs an erroneous codeword. In this case, it is preferable to stop the decoding by detecting the "undetectable error event" before the decoding is iterated as many times as the maximum iteration number. However, it is not possible to detect the "undetectable error event" by simply using only the CRC. Further, in this case, the turbo decoder must iterate the decoding as many times as the maximum iteration number, thus increasing the power consumption and the decoding time.

Second, the problems, which may occur in the method for stopping the turbo decoding using the LLR values, are as follows.

(1) In the actual transport channel environment, there is a need for a decoding stopping criterion, which is independent of the frame size and can be obtained without measuring Eb/No. However, in the conventional method, the stopping criterion is dependent upon the values of the frame size and Eb/No.

(2) In order to stop the iterative decoding while obtaining meaningful FER performance, it is necessary to change a threshold used in the LLR-based turbo decoding stopping method according to the Eb/No and the frame size. However, in the actual environment, it is very difficult to implement a proper estimator.

SUMMARY OF THE INVENTION

It is, therefore, an object of the present invention to provide an error correction apparatus and method for more effectually stopping iterative decoding in a CDMA mobile communication system.

It is another object of the present invention to provide an error correction apparatus and method having a stopping criterion for reducing a decoding time for iterative decoding by a decoder in a CDMA mobile communication system using a turbo code.

It is further another object of the present invention to provide an error correcting apparatus and method for reducing power consumption caused by iterative decoding by a decoder in a CDMA mobile communication system using a turbo code.

It is yet another object of the present invention to provide an error correction apparatus and method using a log likelihood ratio (LLR) as a criterion for stopping turbo decoding in a CDMA mobile communication system using a turbo code.

It is still another object of the present invention to provide an error correction apparatus and method capable of stopping turbo decoding even when a CRC bit is separated from its transport block due to frame segmentation, in a CDMA mobile communication system.

It is still another object of the present invention to provide an error correction apparatus and method for updating a threshold, criterion for determining a stop of decoding, using a minimum absolute value of LLR values in a CDMA mobile communication system.

It is still another object of the present invention to provide an error correction apparatus and method using both of CRC-based stopping criterion and a LLR-based stopping criterion at every iteration in a CDMA mobile communication system.

To achieve the above objects, the present invention provides a novel stopping criterion for stopping turbo decoding to prevent unnecessary iterative decoding in a CDMA mobile communication system using a turbo code, when a frame input to a turbo encoder has no CRC bit or failed CRC bits. The novel stopping criterion can be simply realizable by hardware and equally applicable regardless of Eb/No and a frame size. Further, in order to reduce a decoding time and power consumption despite the use of the CRC bits for error correction in the frame input to the turbo encoder, the present invention can implement an error correction apparatus and method selectively using both of the novel stopping criterion and CRC-based stopping criterion.

According to a first aspect of the present invention, there is provided a method for stopping iterative decoding in a turbo decoder performing iterative decoding on a received frame comprised of information bits and then outputting the iteratively decoded results. The method comprises sequentially outputting absolute LLR values associated with the respective information bits of the received frame by the iterative decoding; selecting a minimum value M(i) among the sequentially output absolute LLR values in $i^{th}$ decoding process; issuing a command to stop the iterative decoding after additionally performing the iterative decoding once, if the minimum value M(i) is larger than a first threshold $T_1(i)$ determined based on a minimum value $F_{min}$ among absolute LLR values output through previous iterative decoding; and stopping the iterative decoding on the received frame in response to the command, and outputting the decoded results at the stop point.

According to a second aspect of the present invention, there is provided a method for stopping iterative decoding in a turbo decoder performing iterative decoding on a received frame comprised of information bits and then outputting the iteratively decoded results. The method comprises sequentially outputting absolute LLR values associated with the respective information bits of the received frame by the iterative decoding; selecting a minimum value M(i) among the sequentially output absolute LLR values in $i^{th}$ decoding process; issuing a command to stop the iterative decoding when the selected minimum value M(i) is satisfied with both of the following two conditions, (1) the one is a case where the minimum value M(i) is larger than a first threshold T1(i) determined based on a minimum value $F_{min}$ among minimum values M(i) output through previous iterative decoding, and (2) the other is a case where the minimum value M(i) is larger than a second threshold T2(i) determined based on a minimum value $I_{min}$ among minimum values M(i) satisfying the aforesaid condition (1); and stopping the iterative decoding in response to the command and then outputting the decoded results at the stop point.

According to a third aspect of the present invention, there is provided an apparatus for stopping iterative decoding in a turbo decoder performing iterative decoding on a received frame comprised of information bits and then outputting the iteratively decoded results. The apparatus comprises a turbo decoder for sequentially outputting absolute LLR values associated with the respective information bits of the received frame by the iterative decoding, and stopping the iterative decoding in response to a stop command for the iterative decoding; a minimum absolute LLR detector for selecting a minimum value M(i) among the sequentially output absolute LLR values; a comparison selector for comparing said minimum value M(i) with the first threshold and updating threshold in accordance with the minimum absolute LLR values output from the minimum absolute LLR detector; and a controller for issuing a command to stop the iterative decoding, if the minimum value M(i) is larger than a first threshold determined based on a minimum value $F_{min}$ among absolute LLR values output through previous iterative decoding.

According to a fourth aspect of the present invention, there is provided an apparatus for stopping iterative decoding in a turbo decoder performing iterative decoding on a received frame comprised of information bits, and then outputting the iteratively decoded results. The apparatus comprises a turbo decoder for sequentially outputting absolute LLR values associated with the respective information bits of the received frame by the iterative decoding, and stopping the iterative decoding in response to a stop command for the turbo decoding; a minimum absolute LLR detector for selecting a minimum value M(i) among the sequentially output absolute LLR values; a comparison selector for comparing said minimum value M(i) with a first threshold and in sequence comparing said minimum value M(i) with a second and updating threshold in accordance with the minimum absolute LLR values output from the minimum absolute LLR detector; and a controller for issuing a command to stop the iterative decoding, if the minimum value M(i) is larger than a first threshold $T_1(i)$ determined based on a minimum value $F_{min}$ among absolute LLR values output through previous iterative decoding and is also larger than a second threshold $T_2(i)$ determined based on $I_{min}$ which is the minimum value among minimum absolute LLR values that has satisfied the first stop condition in up to the previous decoding process for a currently decoded frame.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
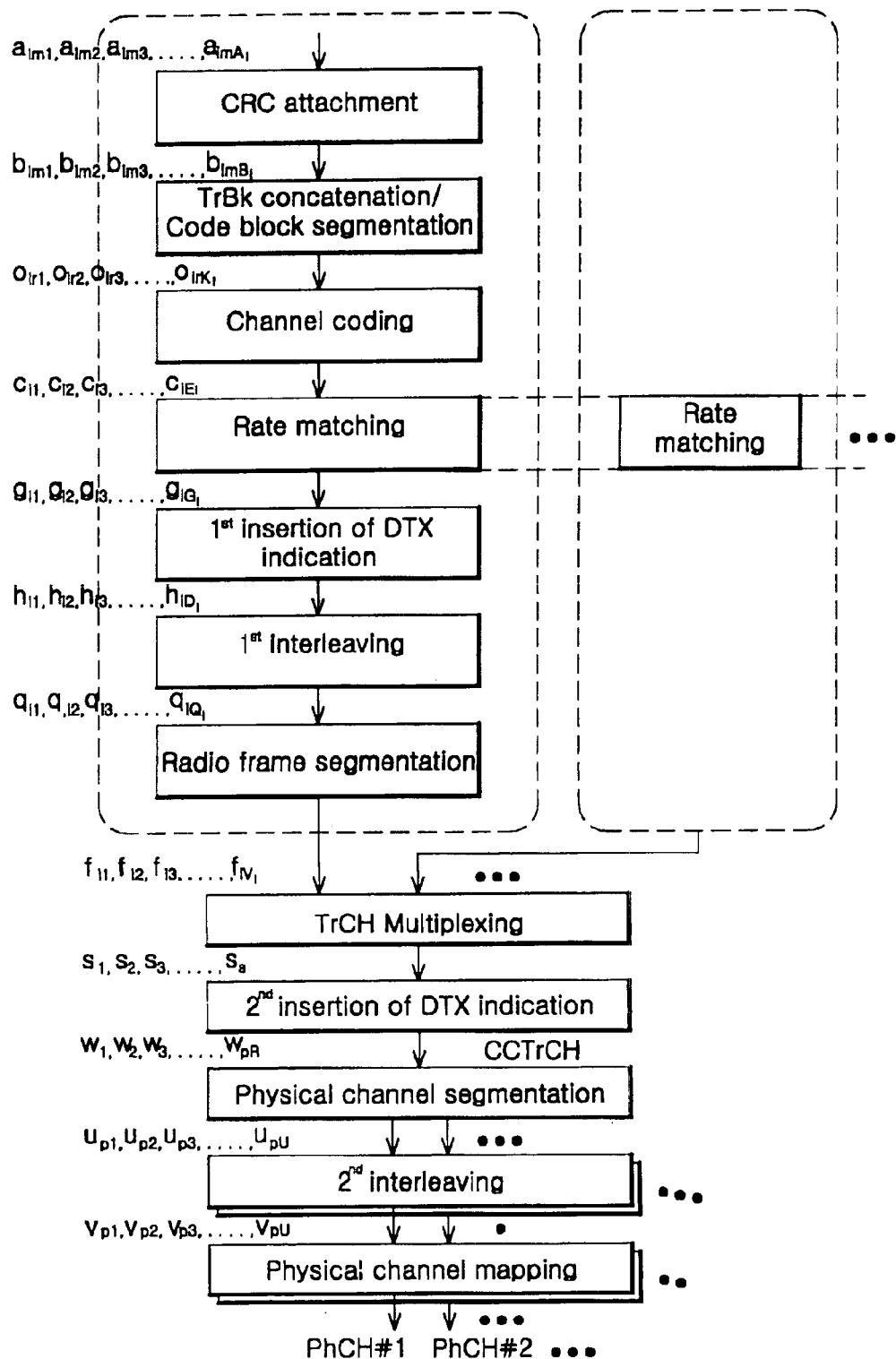
FIG. 1 illustrates a process for creating a downlink channel in a general CDMA mobile communication system.
Figure 2:
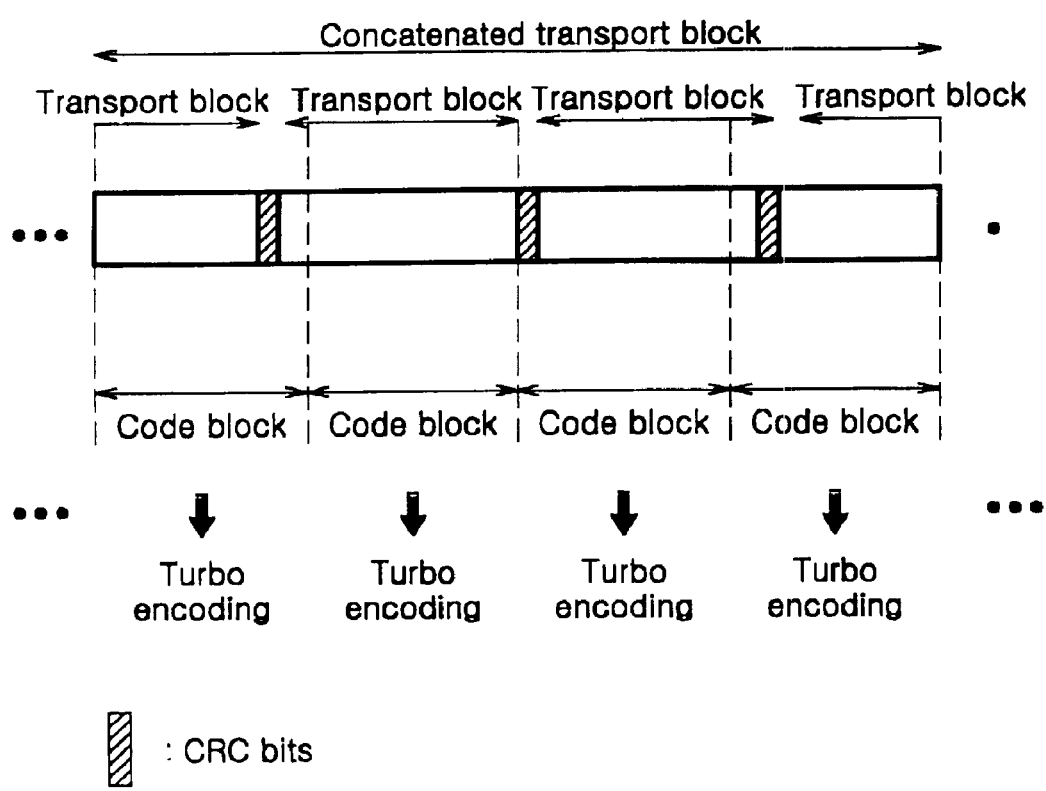
FIG. 2 illustrates an exemplary method for segmenting a concatenated transport block into code blocks in the general CDMA mobile communication system.

A preferred embodiment of the present invention will be described herein below with reference to the accompanying drawings. In the following description, well-known functions or constructions are not described in detail since they would obscure the invention in unnecessary detail.

The present invention has been proposed considering the fact that a change in the minimum absolute value of LLR values is variable depending on the type of error generated in a received frame in the system using a turbo code. That is, when a turbo decoder iteratively decodes a frame, several types of errors shall be generated in the frame. The error types are classified into a "correctable error", a "detectable error" and an "undetectable error". Further, probabilities of the errors are also classified into "correctable error probability", "detectable error probability" and "undetectable error probability". In addition, a change in the minimum absolute LLR value, caused by the iterative decoding, has the characteristic described below.

1. Correctable Error

As a received frame is subject to iterative decoding, it converges into a specific codeword. When the received frame has a correctable error, the codeword corresponds to a correctly decoded codeword. Thus, the decoding result will remain unchanged, even though the frame is further subject to the iterative decoding. That is, the frame is decoded into a correct codeword transmitted from the transmitter. In this case, the minimum absolute LLR value increases with the decoding iteration number, because the reliability of the decoded codeword is represented by LLR.

2. Undetectable Error

Like in the case of the correctable error, as a received frame is subject to iterative decoding, it converges into a specific codeword and location and quantity of error in decoded frame is fixed with the decoding iteration number. However, the codeword is a codeword affected by an error generated in the correct codeword transmitted by the transmitter, so that it is not possible to correct this error even though the received frame is further subject to the iterative decoding. This error event occurs due to excessive errors on the transport channel. In this case also, the minimum absolute LLR value increases with the decoding iteration number. Thus, this error is indistinguishable from the correctable error.

3. Detectable Error

Unlike in the case of the correctable error and the undetectable error, as a received frame is subject to iterative decoding, it continuously transitions between a plurality of codewords, rather than converging into a specific codeword. Therefore, as the result of the decoding, a relatively large number of errors are generated, and the number of errors is not remarkably decreased but continuously changed, even though the iterative decoding is continuously performed. Even this error event occurs due to the excessive errors on the transport channel, the minimum absolute LLR value is very small value and the minimum absolute LLR value scarcely increases in spite of an increase in the decoding iteration number. Thus, this error is distinguishable from the correctable error and the detectable error.

The turbo decoding stopping criterion (hereinafter, referred to as "stopping criterion" for short) according to the present invention divides a frame input to the turbo decoder into a type A, which corresponds to the first and second events among the above three error events, and a type B, which corresponds to the third event, based on the minimum absolute LLR value output at every iteration. Therefore, if it is considered that the input frame corresponds to the type A, the turbo decoding is stopped without iteration of the decoding any longer. Here, there are two available methods for stopping the turbo decoding, and those methods will be described herein below.

Describing the first method, if the minimum absolute LLR value of a frame is larger than a predetermined threshold in an iterative decoding process for the frame input to the turbo decoder, the frame is considered as a frame corresponding to the type A. In order to obtain stable FER performance based on the frame size and Eb/No, criteria indicating a reception state of a channel, the threshold is not fixed depending on the Eb/No and the frame size, but determined by calculating minimum absolute LLR values created in the previous iterative decoding process and then adding an adding factor, which will be described later, to the minimum value selected from the calculated values. If the above condition is satisfied, the decoding is iterated once again before stopping the decoding. This is to prevent the uncorrected error caused by previously stopping the decoding based on only the above stop condition, from affecting the FER performance in a region where Eb/No is high. Herein, this will be referred to as a "first stop condition".

Describing the second method, in order to guarantee improved FER performance, if a selected minimum absolute LLR value is satisfied with the first threshold, then subsequently it is checked that the selected minimum absolute LLR value is also satisfied with the second threshold. And then, when checked that the selected minimum absolute LLR value is satisfied with both the first and second threshold, the controller stops the iterative decoding. Herein, the second threshold is determined based on $I_{min}$, which is the minimum value among minimum absolute LLR values that has satisfied the first stop condition in up to the previous decoding process for a currently decoded frame. Herein, this will be referred to as a "second stop condition". By supplementing such an algorithm, it is possible to stop the turbo decoding without a loss of the FER performance regardless of the Eb/No and the frame size, in performing iterative decoding on the turbo code.

Prior to a detailed description of the present invention, a definition of the terms used herein will be given below.

The term "frame length (FL)" refers to the size of an input frame provided to the turbo encoder, i.e., the number of information word bits that one input frame include. "k" ($0 \leq k \leq FL$) indicates the sequence of the information word bits constituting the input frame, and "MAX_ITERATION" indicates the maximum decoding iteration number previously determined by the turbo decoder. "i" ($0 \leq i \leq MAX\_ITERATION$) represents a current decoding iteration number, while "j" ($0 \leq j \leq i$) represents a previous decoding iteration number. Further, "LLR(k)" represents a soft decision output of the turbo decoder for a $k^{th}$ information word bit of one frame. "MAX" is a constant determined to be larger than all available LLR values, and is a value for initialization when the algorithm starts its operation. The constant MAX does not greatly affect the operation of the algorithm according to the present invention. "$T_f$" is an adding factor for a threshold of a stopping criterion used for the first turbo decoding stop test, while "$T_d$" is an adding factor for a threshold of a stopping criterion used for the second turbo decoding stop test. "$F_{min}$" represents the minimum value among minimum absolute LLR values calculated in up to the previous decoding process for a currently decoded frame, and "$I_{min}$" represents the minimum value among minimum absolute LLR values that has satisfied the first stop condition in up to the previous decoding process for a currently decoded frame. "$T_1(i)$" indicates a threshold used for the first turbo decoding stop test, and "$T_2(i)$" indicates a threshold used for the second turbo decoding stop test. Finally, "m_flag" (m_flag=1 or 2) means a factor indicating a mode of the turbo decoding stop test.

An outline of the overall algorithm for the new turbo decoding stopping method according to the present invention has been described, and the detailed description of each part will be given later. The new turbo decoding stopping method according to the present invention comprises a measure and thresholds, given below.

1. Measure of Stopping Criterion M(i)

This is a value measured at every iteration for an efficient decoding stop in the iterative turbo decoding process. This value is defined as a minimum absolute LLR value output at the $i^{th}$ iteration.

2. First Threshold of Stopping Criterion $T_1(i)$

This is a first threshold for stopping the iterative decoding. If the M(i) satisfies the first turbo decoding stop condition exceeding the first threshold T(i), the decoding is stopped after one additional iteration, or it is determined whether the second turbo decoding stop condition is satisfied.

3. Second Threshold of Stopping Criterion $T_2(i)$

This is a second threshold for stopping the iterative decoding. If the M(i) satisfies the second threshold $T_2(i)$ as well as the first threshold $T_1(i)$, the decoding is stopped.

A method for calculating the measure M(i) and the thresholds $T_1(i)$ and $T_2(i)$ will be described below. The M(i)

and the first and second thresholds $T_1(i)$ and $T_2(i)$ are calculated from absolute LLR values $|LLR(k)|$ associated with the respective information word bits at each iteration. In Equation (1) below, "min" represents a function for calculating the minimum value, and "$0 \leq k \leq FL-1$, iteration=i" means that k ranges from $0^{th}$ bit to $FL-1^{th}$ bit while calculating the minimum value at the $i^{th}$ iteration, i.e., the minimum value is calculated for all information word bits of the input frame. That is, Equation (1) represents that an absolute LLR value $|LLR(k)|$ with the minimum k ($0 \leq k \leq FL-1$) at the $i^{th}$ iteration is selected as M(i).

$$M(i) = \min_{\substack{0 \leq k \leq FL-1 \\ iteration=i}} |LLR(k)| \qquad \text{Equation (1)}$$

$$T_1(i) = \min_{1 \leq j \leq i-1} \left[ \min_{\substack{0 \leq k \leq FL-1 \\ iteration=j}} |LLR(k)| \right] + T_f, \; T_1(0) = \text{MAX}$$

$$T_2(i) = I\min + T_d$$

In Equation (1), M(i) is the minimum absolute value among the absolute LLR values output from the frame, which is currently decoded at the $i^{th}$ iteration. $T_1(i)$ is a value determined by adding an adding factor $T_f$ to the minimum absolute value among the absolute LLR values calculated in up to the $(i-1)^{th}$ iterative decoding process, and T(2) is a value determined by adding an adding factor $T_d$ to the M(i) value for the case where the first turbo decoding stop test is passed. The embodiment of the present invention does not use the thresholds $T_1(i)$ and $T_2(i)$, the stopping criteria, as the constants previously determined based on the Eb/No, so that the stopping criteria of the turbo decoder operates regardless of the Eb/No and the frame size. Instead, the thresholds $T_1(i)$ and $T_2(i)$ are updated using information on the LLR values continuously output during iteration of the turbo decoding. Since the LLR values represent transport channel situation therein, it is not necessary to previously determine the thresholds depending on Eb/No.

Figure 3:
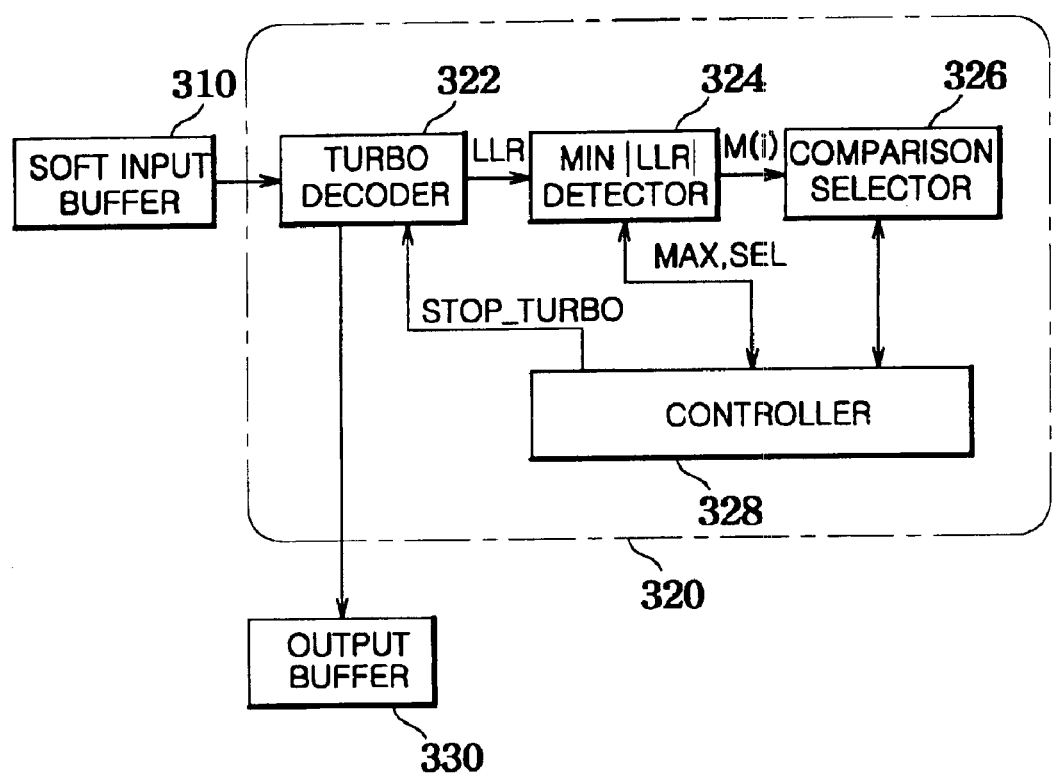
FIG. 3 illustrates a structure of a turbo decoder to which a stopping criterion according to the present invention is applied.
Figure 4:
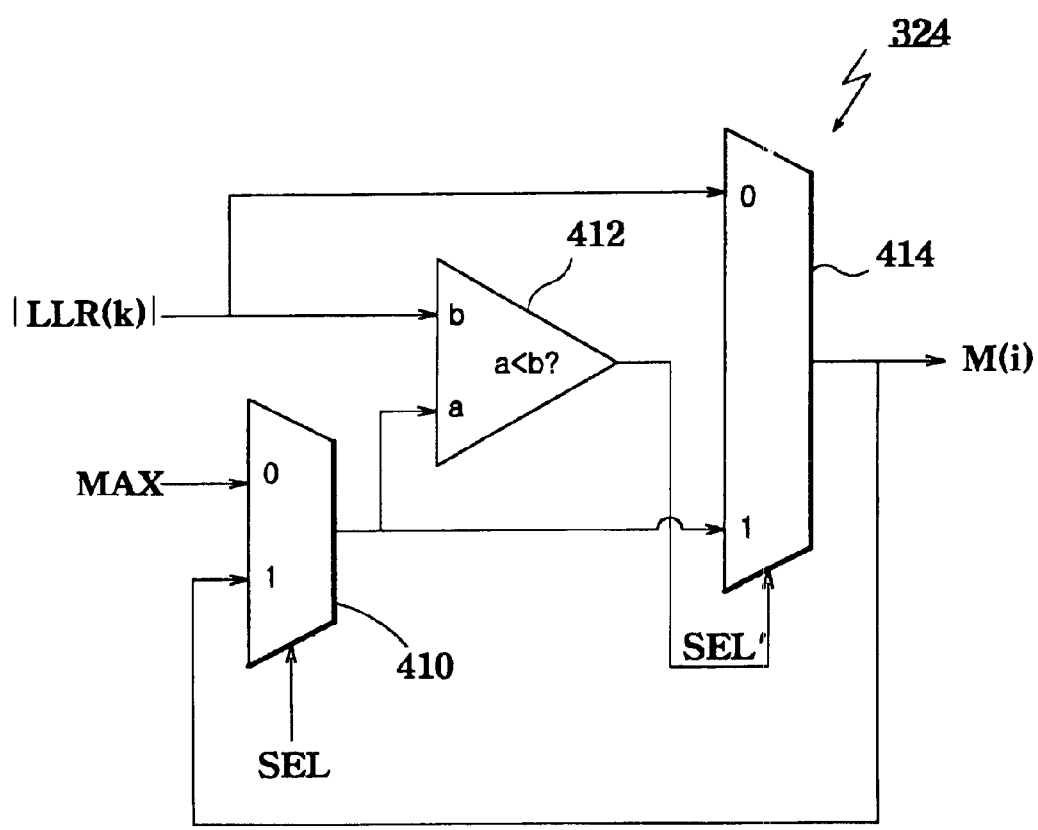
FIG. 4 illustrates a detailed structure of the minimum absolute LLR detector of FIG. 3.

FIG. 3 illustrates a structure of a turbo decoder to which a stopping criterion according to the present invention is applied. Referring to FIG. 3, a soft input buffer 310 buffers input frames received over a transport channel in a frame unit. A decoding part 320 performs turbo decoding on the frames output from the soft input buffer 310. Further, the decoding part 320 determines whether to stop the turbo decoding based on a stopping criterion, and provides the turbo-decoded values to an output buffer 330. The decoding part 320 includes a turbo decoder 322, a minimum absolute LLR detector 324, a comparison selector 326 and a controller 328. The turbo decoder 322 performs error correction and decoding, through turbo decoding, on the frame bits output from the soft input buffer 310, and provides the decoded results to the output buffer 330 in response to a stop signal STOP_TURBO from the controller 328. In addition, the turbo decoder 322 calculates absolute LLR values $|LLR(k)|$ associated with the respective frame bits output from the soft input buffer 310. The minimum LLR detector 324 receives the $|LLR(k)|$ values of the currently decoded frame, provided from turbo decoder 322, and an initial maximum value MAX and a select signal SEL, provided from the controller 328, and then outputs a minimum absolute LLR value (min $|LLR(k)|$,M(i)), among the $|LLR(k)|$ values based on the MAX and the SEL. A detailed structure of the minimum absolute LLR detector 324 is illustrated in FIG. 4. The comparison selector 326 compares M(i) of the currently decoded frame, obtained by the minimum absolute LLR detector 324, with a threshold, and updates the $F_{min}$ or $I_{min}$ value and then registers the updated values, if the M(i) is less than the threshold. The controller 328 determines whether to stop the turbo decoding based on the comparison results from the comparison selector 326. Further, the controller 328 outputs the STOP_TURBO signal according to the determined results. For example, if the controller 328 determines to stop the turbo decoding, it switches the STOP_TURBO signal from '0' to '1' so that the turbo decoder 322 stops the turbo decoding and outputs the decoded frame to the output buffer 330. When the turbo decoder 322 receives the STOP_TURBO signal from the controller 328, the turbo decoder 322 stop the iterative decoding and provides the decoded results to the output buffer 330. An operation of the decoding part 320 for stopping the turbo decoding is performed in accordance with a flow chart of FIG. 5.

As described above, the most important thing in implementing the present invention is to provide a scheme for comparing absolute LLR values $|LLR(k)|$ output in the process of decoding the code blocks. The calculated minimum $|LLR(k)|$ value is registered in a register and this value is analyzed by an upper layer in a given test mode thereby to determine whether to further iterate the decoding.

FIG. 4 illustrates a detailed structure of the minimum absolute LLR detector 324 of FIG. 3. Specifically, FIG. 4 illustrates a scheme for detecting the minimum value M(i) among the absolute LLR values in order to stop the turbo decoding according to an embodiment of the present invention. As illustrated in FIG. 4, the scheme for calculating the minimum absolute LLR value among the absolute LLR values associated with the respective decoded frame bits is comprised of one comparator and two selectors.

Referring to FIG. 4, a first selector 410 receives an initial maximum value MAX from the controller 328 and the output M(i) of the minimum absolute LLR detector 324, and selects one of the two inputs based on the select signal SEL from the controller 328. The controller 328 first provides a SEL signal for selecting the MAX, and next provides a SEL signal for selecting the output of the minimum absolute LLR detector 324. That is, the SEL signal has a value of '0' for only the first bit, and has a value of '1' for the other bits. A comparator 412 receives the output of the first selector 410 and the $|LLR(k)|$ value from the turbo decoder 322 as its inputs 'a' and 'b', respectively, compares the two inputs 'a' and 'b', and then outputs a selected signal to a second selector 414 based on the compared results. For example, if the $|LLR(k)|$ is larger than the output of the first selector 410 (i.e., a<b), then the comparator 412 outputs '1'. Otherwise, if the condition "a<b" is not satisfied, the comparator 412 outputs '0'. The second selector 414 receives the $|LLR(k)|$ and the output of the first selector 410 at its input ports 0 and 1, respectively, and selects, as M(i), one of the inputs at the input ports 0 and 1 based on the selected signal from the comparator 412. For example, if the selected signal from the comparator 412 is '0', the second selector 414 selects the input at its input port 0 as its output, and if the selected signal from the comparator 412 is '1', the second selector 414 selects the input at its input port 1 as its output. As described above, the minimum absolute LLR detector 324 of FIG. 4 initializes a value registered in the register to the maximum value MAX, and then updates the register while comparing the $|LLR|$ values associated with information word bits of the frame with the value registered in the register. As a result, the value finally remaining in the register becomes M(i).

Figure 5:
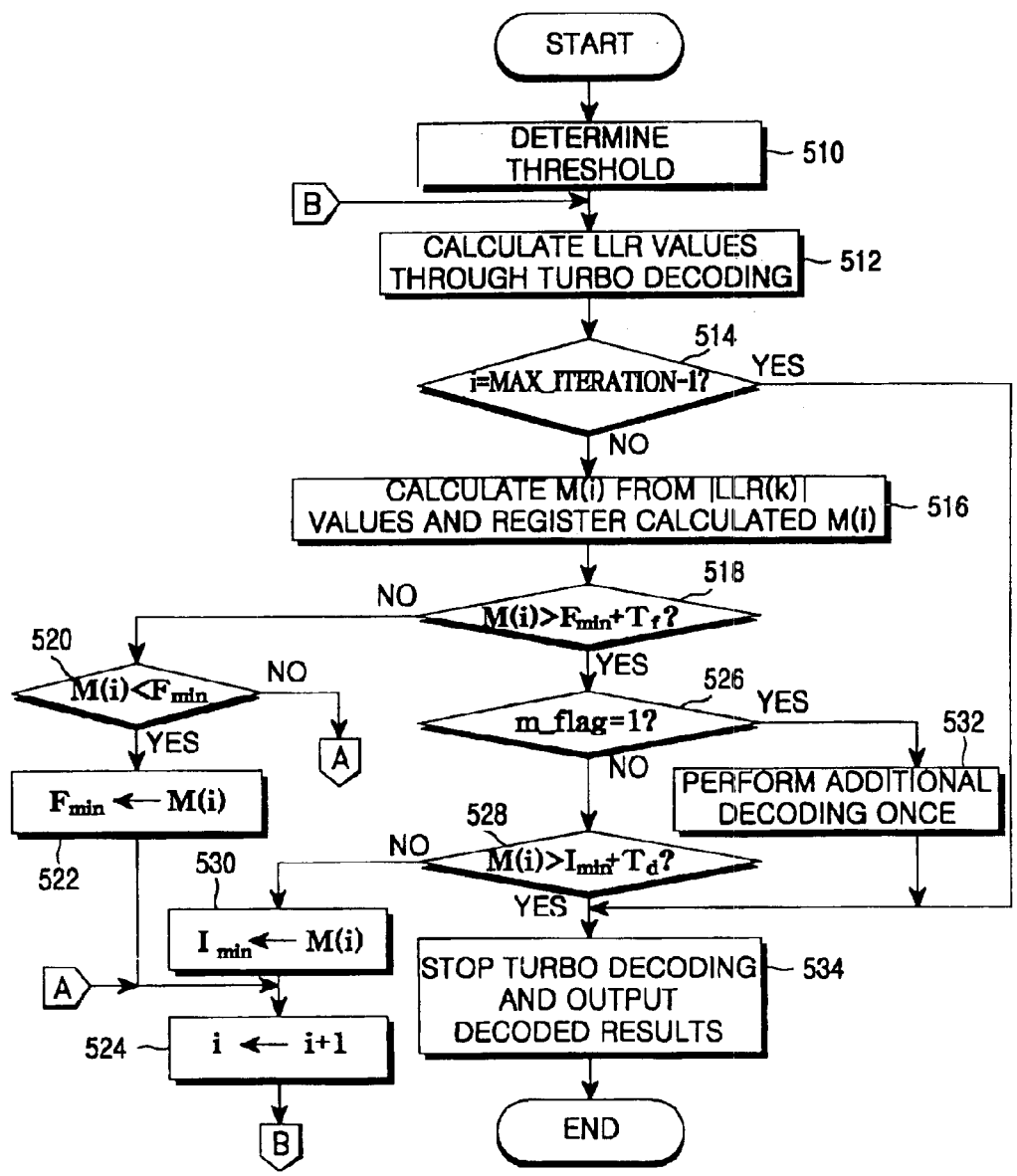
FIG. 5 illustrates a flow chart of stopping iterative decoding by a turbo decoder according to an embodiment of the present invention.

FIG. 5 illustrates a flow chart of a decoding scheme for stopping iterative decoding by a turbo decoder according to an embodiment of the present invention. Referring to FIG.

5, if an m_flag value is set to 1, the decoding scheme according to the present invention stops the decoding after additionally performing the decoding once, provided that a first turbo decoding stop test condition is satisfied. In contrast, if the m_flag is set to 2, the decoding scheme analyzes a second turbo decoding stop test condition in the additional iterative decoding process even after the first turbo decoding stop test condition is satisfied, and then stops the decoding, provided that both of the two stop conditions are satisfied. The decoding scheme according to the present invention must satisfy the first turbo decoding stop test condition, regardless of the set m_flag value. That is, the decoding scheme cannot satisfy the second turbo decoding stop test condition unless it satisfies the first turbo decoding stop test condition.

Shown in Table 1 is a decoding stop algorithm associated with the flow chart, illustrated in FIG. 5, of the turbo decoder according to an embodiment of the present invention. In the algorithm shown in Table 1, MAX is initially set to 127. The MAX, if it is initialized to a sufficiently large value, does not affect performance of the invention.

TABLE 1 i = 0, $F_{min}$ = MAX, $I_{min}$ = MAX
do
    Turbo decoding of $i^{th}$ iteration
    Find M(i) (minimum |LLR|)
    flag = 0 -- initialization of a flag value
    if ( M(i) > $F_{min}$ + $T_f$) -- first decoding stop condition
        flag = flag + 1
    end if
    $F_{min}$ = minimum M(j) for all j<=i
        if (flag == 1) -- second decoding stop condition
        if ( M(i) > $I_{min}$ + Td )
            flag = flag + 1
        else $I_{min}$ = M(i)
        end if
    end if
    i = i + 1
while (flag < m_flag and i < MAX_ITERATION)
if (flag == 1 and i < MAX_ITERATION) one more turbo decoding
end if In the turbo decoding stop algorithm shown in Table 1, a flag value indicating whether the minimum absolute LLR value of a frame satisfies a given turbo decoding stop condition must be larger than m_flag in order to stop the decoding. Here, the reason for using the m_flag is as follows. Of course, the m_flag value is previously determined by the user according to a decoding mode.

If the m_flag value is set to 1, it is determined whether the first turbo decoding stop test condition is satisfied. If the condition is satisfied, the turbo decoding is additionally performed once more before being stopped. However, if the m_flag value is set to 2, even the second turbo decoding stop test condition should be satisfied in the additional decoding process in order to stop the decoding. Therefore, in the embodiment of the present invention, the second turbo decoding stop test condition cannot be satisfied ($I_{min}$=MAX) unless the first turbo decoding stop test condition is not satisfied at least once, as stated above.

An operation of the present invention will be described herein below with reference to FIGS. 3 to 5.

Referring to FIGS. 3 to 5, in step 510 of FIG. 5, the controller 328 performs an initialization process. In the initialization process of step 510, the controller 328 determines a first adding factor $T_f$ for a first turbo decoding stop test criterion, a second adding factor Td for a second turbo decoding stop test criterion and an m_flag value for determining a turbo decoding stop mode. Further, in the initialization process, $F_{min}$ and $I_{min}$ are set to MAX, and i for counting the decoding iteration number is initialized to '0'.

After the initialization is completed, LLR values are calculated through turbo decoding in step 512. Specifically, the turbo decoder 322 in the decoding part 320 performs turbo decoding on the frame provided from the soft input buffer 310. Further, the turbo decoder 322 calculates LLR values associated with the respective frame bits and outputs absolute values |LLR(k)| of the calculated LLR values. The |LLR(k)| values are provided to the minimum absolute LLR detector 324.

After the |LLR(k)| values are calculated through the turbo decoding in the step 512, the controller 328 determines in step 514 whether the turbo decoding has been iterated as many times as a predetermined maximum iteration number. The determination is carried out by comparing a value MAX_ITERATION−1 determined by subtracting 1 from the maximum iteration number MAX_ITERATION with a current iteration number i. For example, if i=MAX_ITERATION−1 after the decoding is performed in the step 512, the controller 328 proceeds to step 534 where it stops the turbo decoding and then requests the turbo decoder 322 to output the results decoded in the step 512. That is, the controller 328 provides a control signal STOP_TURBO, i.e., a turbo decoding stop command, to the turbo decoder 322. Upon receiving the control signal STOP_TURBO, the turbo decoder 322 outputs the turbo-decoded results to the output buffer 330.

However, if it is determined in the step 514 that the turbo decoding has not been iterated as many times as the preset number, a minimum value M(i) among the |LLR(k)| values calculated in the step 512 is calculated and then registered in step 516. Specifically, having been provided with the |LLR(k)| values from the turbo decoder 322, the minimum LLR detector 324 calculates the M(i) based on the MAX set in the initialization process and the select signal SEL provided from the controller 328. The M(i) is calculated in accordance with Equation (1).

FIG. 4 illustrates a hardware structure for calculating the M(i). Referring to FIG. 4, after initializing a value of the register to MAX, the minimum LLR detector 324 updates the register while comparing the |LLR(k)| values associated with the information word bits of the frame with the value registered in the register, and then the value finally remaining in the register becomes M(i). The calculated value M(i) is provided to the comparison selector 326 and the controller 328.

After the M(i) is calculated in step 516, the comparison selector 326 determines in step 518 whether the first turbo decoding stop test condition, M(i)>$F_{min}$+$T_f$, is satisfied. That the first turbo decoding stop test condition, M(i)>$F_{min}$+$T_f$, is satisfied means that the calculated value M(i) is larger than a first threshold $T_1$(i) determined by adding the $T_f$ value set in the initialization process to the currently set $F_{min}$ value. The $F_{min}$ value is a variable, which will be described later.

If the first turbo decoding stop test condition is satisfied in the step 518, the flow chart proceeds to step 526. Otherwise, the flow chart proceeds to step 520 to reset the $F_{min}$. In the step 520, the comparison selector 326 determines whether to reset the $F_{min}$ by comparing the M(i) with the $F_{min}$. If M(i)<$F_{min}$ in the step 520, the controller 328 sets the M(i) to $F_{min}$ in step 522, and then proceeds to step 524. However, if the M(i) is not less than the $F_{min}$ in the step 520, the controller 328 jumps to the step 524 without performing the process of resetting the $F_{min}$. In the step 524, the controller 328 increase the i value by one, and then returns to the step 512 to iterate the turbo decoding. If the turbo decoder 322 uses a fixed point RESOVA algorithm, it fixedly sets the $F_{min}$ to 0, so the update process of the step 522 can be omitted. This is based on the assumption that in the case of the fixed point RESOVA algorithm, the minimum value due to iteration of the minimum absolute LLR value of a frame can approximate to 0.

In the step 526, the controller 328 determines the currently set decoding stop mode by checking the m_flag set in the initialization process. As stated above, there are two decoding stop modes. The first stop mode corresponds to the case where the m_flag is set to 1. In this case, if the first turbo decoding stop test condition is satisfied, the turbo decoding is stopped. The second stop mode corresponds to the case where the m_flag is set to 2. In this case, the second turbo decoding stop test condition as well as the first condition must be satisfied in order to stop the turbo decoding. In realizing the actual hardware, the m_flag value is not checked at every iteration, but a decoding stop mode based on an initially set value is continuously used. That is, the decoding stop mode is not changed according to the iterative decoding.

If the m_flag is currently set to 1, it means that the first turbo decoding stop test condition is satisfied in the step 518. Therefore, the controller 328 proceeds to step 532 where it performs additional decoding once, and then requests the stop of the turbo decoding and the output of the decoded results in the step 534. That is, if it is determined by the comparison selector 326 that the first turbo decoding stop test condition is satisfied, after additional decoding and then the controller 328 provides the control signal STOP_TURBO, a turbo decoding stop request command, to the turbo decoder 322.

In contrast, if the m_flag is currently set to 2, the controller 328, together with the comparison selector 326, performs the processes of steps 528, 530 and 524 until the second turbo decoding stop test condition is satisfied. That is, if it is determined by the controller 328 that the m_flag is set to 2, the comparison selector 326 determines in step 528 whether the second turbo decoding stop condition, $M(i) > I_{min} + T_d$, is satisfied. That the second turbo decoding stop condition, $M(i) > I_{min} + T_d$, is satisfied means that the calculated value M(i) is larger than a second threshold $T_2(i)$ determined by adding the $T_d$ set in the initialization process to the currently set $I_{min}$ value. If the second turbo decoding stop test condition is satisfied in the step 528, the flow chart proceeds to step 534. Otherwise, the flow chart proceeds to step 530 to reset the $I_{min}$. In step 530, the comparison selector 326 sets the M(i) to the $I_{min}$, and then proceeds to step 524. In step 524, the controller 328 increases the i value by one, and then returns to step 512 to iterate the turbo decoding. In the case of the first iteration (i=0), the $I_{min}$ is initialized to MAX so the second turbo decoding stop test condition can never be satisfied. Therefore, the turbo decoding should be iterated after updating the $I_{min}$ in step 530.

However, if the second turbo decoding stop test condition is satisfied in the above operation, the controller 328 proceeds to the step 534 where it requests the stop of the turbo decoding and the output of the decoded results. That is, the controller 328 provides the control signal STOP_TURBO, a turbo decoding stop request command, to the turbo decoder 322. Upon receiving the control signal STOP_TURBO, the turbo decoder 322 outputs the results decoded by the turbo decoding operation to the output buffer 330.

Next, another embodiment of the present invention will be described in detail with reference to the accompanying drawings.

Another embodiment of the present invention uses the LLR-based turbo decoding stop scheme according to the first embodiment along with the existing CRC-based turbo decoding stop scheme in order to obtain improved performance. That is, this embodiment performs both the CRC and the stop test based on the minimum absolute LLR value after decoding a frame once, thereby stopping the decoding if any one of the two stop conditions is satisfied.

Figure 6:
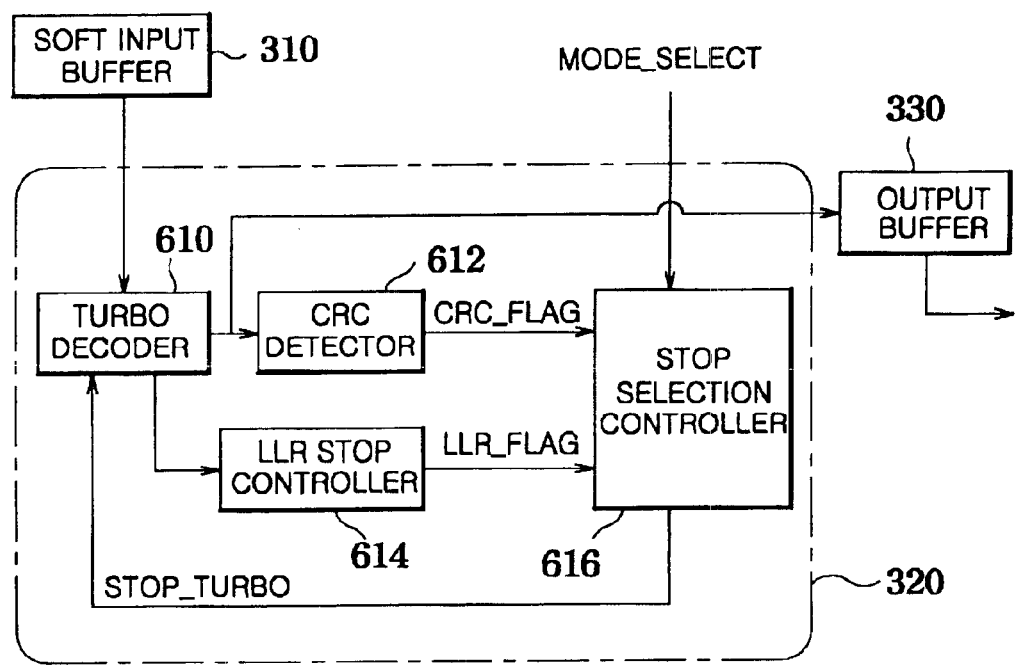
FIG. 6 illustrates a structure of a turbo decoder to which the stopping criterion according to another embodiment of the present invention is applied.

FIG. 6 illustrates a structure of a turbo decoder to which the stopping criterion according to another embodiment of the present invention is applied. Specifically, the turbo decoder supports both the decoding stop scheme according to the first embodiment and the CRC-based decoding stop scheme.

Referring to FIG. 6, a turbo decoder 610 performs error correction and decoding, through turbo decoding, on an input frame received from a soft input buffer 310. A CRC checker 612 detects an error from every frame using CRC bits for the decoded results from the turbo decoder 610, each time the turbo decoding is performed by the turbo decoder 610. The CRC checker 612 outputs a result signal CRC_FLAG for the CRC check. For example, if the CRC check result is 'good', the CRC checker 612 switches the CRC_FLAG from '0' to '1' to stop the decoding. An LLR stop controller 614 has a function of testing the LLR-based decoding stop condition according to the first and second embodiments of the present invention. That is, the minimum LLR detector 324, the comparison selector 326 and the controller 328 of FIG. 3 correspond to the LLR stop controller 614. For example, if a frame satisfies the decoding sop criterion according to the present invention, the LLR stop controller 614 switches its LLR_FLAG signal from '0' to '1' to stop the decoding. A stop selection controller 616 receives the CRC_FLAG signal from the CRC checker 612 and the LLR_FLAG signal from the LLR stop controller 614. The stop selection controller 616 selects the turbo decoding stop mode based on the two inputs. If a _FLAG (CRC_FLAG or LLR_FLAG) signal of the selected decoding stop mode is '1', the stop selection controller 616 outputs the control signal STOP_TURBO for stopping the turbo decoding being performed by the turbo decoder 610. For example, upon receiving a stop request caused by the _FLAG (CRC_FLAG or LLR_FLAG), the stop selection controller 616 switches the STOP_TURBO signal from '0' to '1' thereby to stop further decoding. The decoding stop modes are selected based on a control signal MODE_SELECT. In the case where only the CRC-based decoding stop mode is used, if the CRC_FLAG signal is changed from '0' to '1', the STOP_TURBO signal is also changed from '0' to '1', thus stopping the decoding. Further, in the case where the CRC-based decoding stop mode and the LLR-based decoding stop mode are used together, if any one of the CRC_FLAG signal and the LLR_FLAG signal is changed to '1', the STOP_TURBO signal is changed from '0' to '1', thus stopping the decoding. After stopping the decoding, the turbo decoder 610 outputs the decoded results to the output buffer 330.

Shown in Table 2 are the stop modes selected by the stop selection controller 616 in response to the MODE_SELECT signal.

TABLE 2

| Mode | Decoding Stop Modes |
| --- | --- |
| 00 | CRC only |
| 01 | CRC or LLR (m_flag = 1) |
| 10 | CRC or LLR (m_flag = 2) |
| 11 | Reserved bit |

As shown in Table 2, the stop selection controller 616 selects the CRC-based decoding stop mode in response to a MODE_SELECT signal of '00', and selects the CRC-based or LLR (m_flag=1)-based decoding stop mode in response to a MODE_SELECT signal of '01'. Further, the stop selection controller 616 selects the CRC-based or LLR (m_flag=2)-based decoding stop mode in response to a MODE_SELECT signal of '10', and selects a reserved state in response to a MODE_SELECT signal of '11'. That is, another mode in addition to the above three modes can be realized by the reserved bit.

Reference will now be made to simulation results of the turbo decoder according to the preferred embodiments of the present invention.

Experiment #1

A test mode is used where both the first and second turbo decoding stop criteria are used (m_flag=2).

| Experimental Environment #1 |
| --- |
| AWGN Channel |
| Turbo encoder: rate 1/3, 3GPP RSC encoder Recursive Systematic Convolutional encoder: component encoder for Turbo code, internal interleaver for Turbo code used in PIL interleaver3GPP, 12 tail bits for trellis termination, interleaver size FL = 336, 1296, 4096 |
| Turbo Decoder: Fixed Point RESOVA Register Exchange Soft Output Viterbi Algorithm: a kind of algorithm for decoding Turbo code, MAX_ITERATION=8 |
| Tf = 5, Td = 10, m_flag = 2 |
| T1(i) = $T_f$ |
| CRC unused |

In the iterative decoding stop algorithm used in Experiment Environment #1, a minimum value obtained by iterating minimum absolute LLR values calculated from a frame is set to 0 ($T_1(i)=T_f$, $F_{min}=0$). Thus, a process for minimizing the $F_{min}$ for the second stopping criterion test can be omitted. This is based on the assumption that in the case of the fixed point RESOVA algorithm, the minimum value obtained by iteration of the minimum absolute LLR value of a frame can approximate to 0.

In Experiment Environment #1, a comparison is made between FER performance of the turbo code obtained based on the stopping criteria according to the invention and FER performance for which an average decoding iteration number can be obtained by Genie-aided turbo decoding. Here, "Genie-aided turbo decoding" refers to a mode for monitoring the number of errors generated in the frame by an experimenter at every iteration and stopping the decoding if no error is detected. That is, this is the most ideal case in terms of FER.

Shown in Table 3 are experimental results obtained through the above experiment.

TABLE 3

| | Genie-aided decoding | Stopping rule |
| --- | --- | --- |
| FER Performance | Best | Almost Best |
| Average Iteration Num | Best | Good |
| Actual Realizability | Impossible | Simply Realizable |

Figure 7:
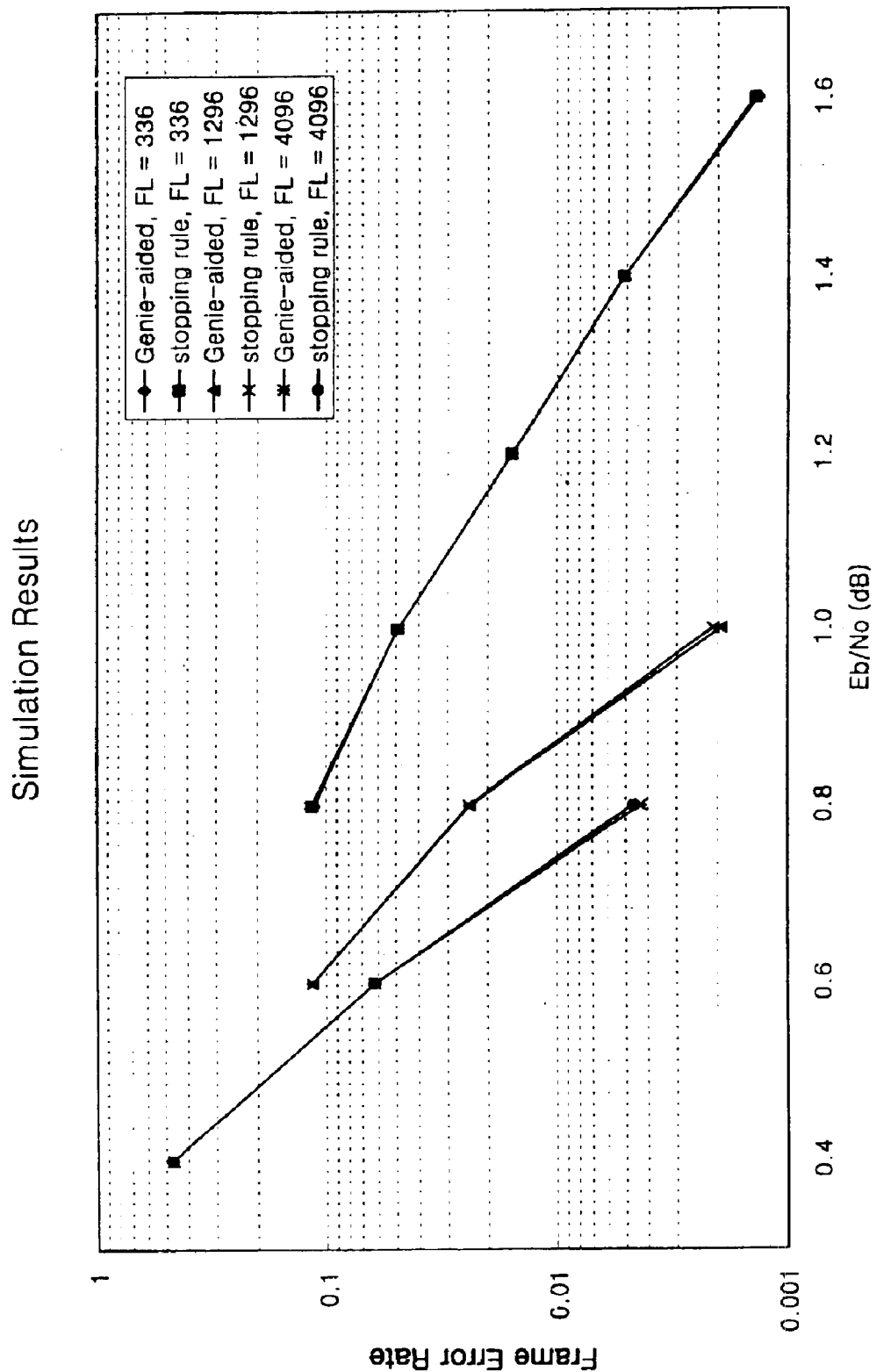
FIGS. 7 and 8 illustrates simulation results according to the different embodiments of the present invention.

FIG. 7 illustrates a comparison between FER performance of a turbo code frame obtained by the Genie-aided turbo decoding and PER performance obtained by performing decoding based on the stopping criteria according to the present invention. It is noted from FIG. 7 that the turbo decoding based on the stopping criteria according to the present invention guarantees very excellent FER performance regardless of the frame size and Eb/No.

Shown in Tables 4 to 6 are comparisons between an average iteration number for the Genie-aided turbo decoding and an average iteration number for the turbo decoding based on the stopping criteria according to the present invention.

TABLE 4

| Eb/No (dB) | Genie-aided | Stopping Rule |
| --- | --- | --- |
| 0.4 | 7.39 | 7.86 |
| 0.6 | 6.03 | 7.20 |
| 0.8 | 4.69 | 6.17 |

TABLE 5

| Eb/No (dB) | Genie-aided | Stopping Rule |
| --- | --- | --- |
| 0.6 | 5.43 | 6.67 |
| 0.8 | 4.30 | 5.68 |
| 1.0 | 3.53 | 4.92 |

TABLE 6

| Eb/No (dB) | Genie-aided | Stopping Rule |
| --- | --- | --- |
| 0.8 | 3.96 | 5.20 |
| 1.0 | 3.21 | 4.58 |
| 1.2 | 2.69 | 4.01 |
| 1.4 | 2.23 | 3.63 |
| 1.6 | 2.09 | 3.33 |

As shown in Tables 4 to 6, when the maximum iteration number is limited to 8, the turbo decoding based on the stopping criterion (rule) according to the invention is increased in its average iteration number by about 1.5 times, compared with the Genie-aided turbo decoding. The increase in the average iteration number is a main cause of the additional one iteration, which should be necessarily performed when the measured minimum absolute LLR value satisfies the thresholds according to the present invention. However, if there is no CRC bits due to segmentation of the transport block into code blocks in the 3GPP system, it is possible to drastically reduce the power consumption and the delay time, though the decoding should be iterated as many times as the maximum iteration number.

Experiment #2

A test based on only the first stopping criterion (m_flag=1) is used along with the CRC-based test.

| Experimental Environment #2 |
| --- |
| AWGN Channel |
| Turbo encoder: 3GPP2 RSC encoder (RC5), internal interleaver for Turbo code used in LCS interleaver3GPP2, 12 tail bits for trellis termination, interleaver size FL = {2296, 4600}, 16 bit CRC |
| Turbo Decoder: Turbo decoding algorithm realized by applying Log operation to MAP algorithm for decoding Fixed Point LogMAPTurbo code, MAX_ITERATION = 8 |
| $T_f$ = 2 (m_flag = 1) |

In Experimental Environment #2, if the minimum absolute LLR value satisfies the first threshold by setting the m_flag value to 1, the decoding is stopped after one additional iteration. Further, in Experimental Environment #2, the 16-bit CRC-based stopping criteria and the stopping criteria based on the algorithm according to the present invention were simultaneously used. That is, if the CRC is 'good' in iteratively decoding a frame of the turbo code, the decoding is stopped, or if the minimum |LLR| value satisfies the threshold, the decoding is stopped after one additional iteration (CRC or LLR stop). In addition, FER and BER (Bit Error Rate) results obtained through this experiment were compared with the case where the decoding is stopped using only the CRC (CRC only stop).

Figure 8:
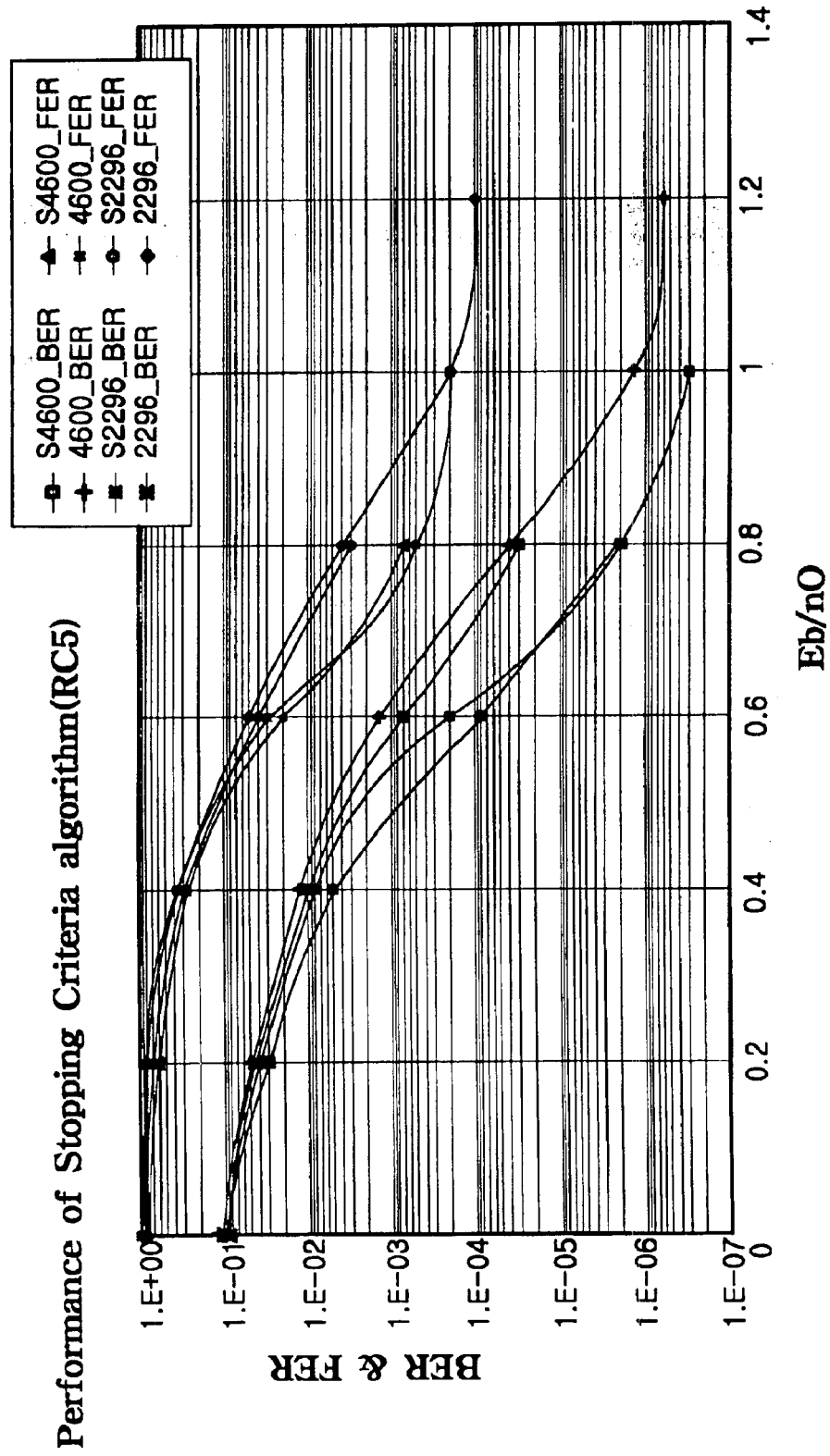

FIG. 8 illustrates a comparison with FER and BER results of the CRC or LLR stop mode and FER and BER results of the CRC only stop mode. In FIG. 8, 'S-' represents CRC or LLR stop mode. Unlike the experiment (Experiment Environment #1) of the 3GPP system, this experiment is carried out on the assumption that there always exist the CRC bits. The experiment shows excellent performance even when the turbo decoding is performed by combining the CRC only stop mode with the LLR stop mode based on the algorithm according to the present invention.

To summarize, the present invention has the following advantages.

First, it is possible to reduce the power consumption and the delay time by preventing unnecessary iterative decoding by providing a simple module to the turbo decoder unable to stop decoding based on the CRC bit.

Second, it is possible to remove overload due to the CRC bit for the turbo code with a small frame size.

Third, it is possible to stop decoding of the turbo decoder even without the CRC bit, if the CRC bit for detecting an error of the transport block by 3GPP turbo decoder is dispersed.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for stopping iterative decoding in a turbo decoder performing iterative decoding on a received frame comprised of information bits and then outputting iteratively decoded results, comprising the steps of:

sequentially outputting absolute LLR (Log Likelihood Ratio) (|LLR|) values associated with respective information bits of the received frame by the iterative decoding;

selecting a minimum value M(i) among the sequentially output absolute LLR values;

issuing a command to stop the iterative decoding, if the minimum value M(i) is larger than a first threshold determined based on a minimum value $F_{min}$ among absolute LLR values output through previous iterative decoding; and stopping the iterative decoding after additionally performing the iterative decoding once on the received frame in response to the command, and outputting the decoded results upon stopping.

2. The method as claimed in claim 1, wherein the first threshold is determined by adding a preset adding factor $T_f$ to the minimum value $F_{min}$.

3. The method as claimed in claim 1, further comprising the step of continuously performing the iterative decoding after updating the minimum value $F_{min}$ with the minimum value M(i) if the minimum value M(i) is less than or equal to the first threshold.

4. The method as claimed in claim 1, further comprising the step of comparing a newly output absolute LLR value (|LLR(k)|) with a minimum absolute LLR value (|LLR(i)|) in up to the previous decoding process for a currently decoded frame and outputting a smaller value as the minimum value M(i).

5. The method as claimed in claim 1, further comprising the step of stopping the iterative decoding and then outputting the decoded results upon stopping, if the iterative decoding has been iterated a preset number of times.

6. A method for stopping iterative decoding in a turbo decoder performing iterative decoding on a received frame comprised of information bits and then outputting iteratively decoded results, comprising the steps of:

sequentially outputting absolute LLR (|LLR|) values associated with respective information bits of the received frame by the iterative decoding;

selecting a minimum value M(i) among the sequentially output absolute LLR (|LLR|)values;

issuing a command to stop the iterative decoding when the selected minimum value M(i) is satisfied with both of the following two conditions, (1) the one is a case where the minimum value M(i) is larger than a first threshold T1(i) determined based on a minimum value $F_{min}$ among minimum values M(i) output through previous iterative decoding, and (2) the other is a case where the minimum value M(i) is larger than a second threshold T2(i) determined based on a minimum value $I_{min}$ among minimum values M(i) satisfying the aforesaid condition (1); and stopping the iterative decoding in response to the command and then outputting the decoded results at the stop point.

7. The method as claimed in claim 6, wherein the first threshold is determined by adding a preset adding factor $T_f$ to the minimum value $F_{min}$.

8. The method as claimed in claim 6, wherein the second threshold is determined by adding a preset adding factor $T_f$ to the minimum value $I_{min}$.

9. The method as claimed in claim 6, further comprising the step of continuously performing the iterative decoding after updating the minimum value $F_{min}$ with the minimum value M(i) if the minimum value M(i) is less than or equal to the first threshold.

10. The method as claimed in claim 6, further comprising the step of continuously performing the iterative decoding after updating the minimum value $I_{min}$ with the minimum value M(i) if the minimum value M(i) is less than or equal to the second threshold.

11. The method as claimed in claim 6, further comprising the step of comparing a newly output absolute LLR value |LLR(k)| with a minimum absolute LLR value (|LLR(i)|) in up to the previous decoding process for a currently decoded frame, and outputting a smaller value as the minimum value M(i).

12. The method as claimed in claim 6, further comprising the step of stopping the iterative decoding and then outputting the decoded results upon stopping, if the iterative decoding has been iterated a preset number of times.

13. An apparatus for stopping iterative decoding in a turbo decoder performing iterative decoding on a received frame comprised of information bits and then outputting iteratively decoded results, comprising:

a turbo decoder for sequentially outputting absolute LLR (|LLR|) values associated with respective information bits of the received frame by the iterative decoding, and stopping the iterative decoding in response to a stop command for the iterative decoding;

a minimum absolute LLR detector for selecting a minimum value M(i) among the sequentially output absolute LLR (|LLR|) values;

a comparison selector for comparing said minimum value M(i) with a first threshold and updating threshold in accordance with the minimum absolute LLR values output from the minimum absolute LLR detector; and a controller for issuing a command to stop the iterative decoding, if the minimum value M(i) is larger than the first threshold determined based on a minimum value $F_{min}$ among absolute LLR (|LLR|) values output through previous iterative decoding.

14. The apparatus as claimed in claim 13, wherein the turbo decoder stops the iterative decoding after additionally performing the iterative decoding once on the received frame in response to the stop command, and then outputs the decoded results upon stopping.

15. The apparatus as claimed in claim 13, wherein the first threshold is determined by adding a preset adding factor $T_f$ to the minimum value $F_{min}$.

16. The apparatus as claimed in claim 13, further comprising a comparison selector for updating the minimum value $F_{min}$ with the minimum value M(i) if the minimum value M(i) is less than or equal to the first threshold.

17. The apparatus as claimed in claim 13, where the minimum absolute LLR detector compares a newly output absolute LLR value |LLR(k)| with a minimum absolute LLR value (|LLR(i)|) in up to the previous decoding process for a currently decoded frame, and outputting a smaller value as the minimum value M(i).

18. The apparatus as claimed in claim 17, wherein the minimum absolute LLR detector comprises:

a first selector for receiving an initialized maximum value and the minimum absolute LLR (|LLR|) value M(i), and selecting one of the threshold and the minimum absolute LLR (|LLR|) value in response to a first select signal from the controller;

a comparator for comparing the sequentially output absolute LLR (|LLR|) values with the output of the first selector, and outputting a second select signal according to the compared results; and a second selector for selecting one of the sequentially output absolute LLR (|LLR|) value and the output of the first selector in response to the second select signal from the comparator, as the minimum absolute LLR (|LLR|) value M(i).

19. The apparatus as claimed in claim 13, wherein the controller issues a command to stop the iterative decoding, if the iterative decoding has been iterated a preset number of times.

20. An apparatus for stopping iterative decoding in a turbo decoder performing iterative decoding on a received frame comprised of information bits and then outputting iteratively decoded results, comprising:

a turbo decoder for sequentially outputting absolute LLR (|LLR|) values associated with respective information bits of the received frame by the iterative decoding, and stopping the iterative decoding in response to a stop command for the turbo decoding;

a minimum LLR detector for selecting a minimum value M(i) among the sequentially output absolute LLR (|LLR|) values;

a comparison selector for comparing said minimum value M(i) with a first threshold and in sequence comparing said minimum value M(i) with a second threshold and updating thresholds in accordance with the minimum absolute LLR values output from the minimum absolute LLR detector; and a controller for issuing a command to stop the iterative decoding, if the minimum value M(i) is larger than the first threshold $T_1(i)$ determined based on a minimum value $F_{min}$ among absolute LLR (|LLR|) values output through previous iterative decoding and is also larger than the second threshold $T_2(i)$ determined based on a minimum value $I_{min}$ representing the minimum value among minimum absolute LLR (|LLR|) values that has satisfied the first stop condition in up to the previous decoding process for a currently decoded frame.

21. The apparatus as claimed in claim 20, wherein the first threshold is determined by adding a preset adding factor $T_f$ to the minimum value $F_{min}$.

22. The apparatus as claimed in claim 21, wherein the second threshold is determined by adding a preset adding factor $T_f$ to the minimum value $I_{min}$.

23. The apparatus as claimed in claim 21, further comprising a comparison selector for updating the minimum value $F_{min}$ with the minimum value M(i) if the minimum value M(i) is less than or equal to the first threshold.

24. The apparatus as claimed in claim 23, wherein the comparison selector updates the minimum value $I_{min}$ with the minimum value M(i) if the minimum value M(i) is less than or equal to the second threshold.

25. The apparatus as claimed in claim 21, wherein the minimum absolute LLR detector compares a newly output absolute LLR value |LLR(k)| with a minimum absolute LLR value (|LLR(i)|) in up to the previous decoding process for a currently decoded frame, and outputs a smaller value as the minimum value M(i).

26. The apparatus as claimed in claim 25, wherein the minimum absolute LLR detector comprises:

a first selector for receiving an initialized maximum value and the minimum absolute LLR value M(i), and selecting one of the threshold and the minimum absolute LLR value in response to a first select signal from the controller;

a comparator for comparing the sequentially output absolute LLR values with the output of the first selector, and outputting a second select signal according to the compared results; and a second selector for selecting one of the sequentially output absolute LLR value and the output of the first selector in response to the second select signal from the comparator, as the minimum absolute LLR value M(i).

27. The apparatus as claimed in claim 21, wherein the controller issues a command to stop the iterative decoding, if the iterative decoding has been iterated a preset number of times.

28. A method for stopping iterative decoding in a turbo decoder, comprising the steps of:

outputting results of iterative decoding performed on a received frame comprised of information bits, and sequentially outputting absolute LLR (|LLR|) values associated with the respective information bits;

performing error checking on the received frame using CRC (Cyclic Redundancy Check) bits for the decoded results, and outputting error checking results;

requesting a stop to the iterative decoding, if a minimum value M(i) among the sequentially output absolute LLR (|LLR|) values is larger than a threshold determined based on a minimum value $F_{min}$ among absolute LLR (|LLR|) values output through previous iterative decoding;

issuing a command to stop the iterative decoding, based on the error checking results and in response to the stop request for the iterative decoding; and stopping the iterative decoding after additionally performing the iterative decoding once on the received frame in response to the command, and then outputting the decoded results upon stopping.

29. The method as claimed in claim 28, wherein the threshold is determined by adding a preset adding factor $T_f$ to the minimum value $F_{min}$.

30. The method as claimed in claim 28, further comprising the step of continuously performing the iterative decoding after updating the minimum value $F_{min}$ with the minimum value M(i) if the minimum value M(i) is less than or equal to the threshold.

31. The method as claimed in claim 28, further comprising the step of issuing a command to stop the iterative decoding if any of the error checking results and the stop request for the iterative decoding is provided.

32. An apparatus for stopping iterative decoding in a turbo decoder, comprising:

a turbo decoder for outputting results of iterative decoding performed on a received frame comprised of information bits, and sequentially outputting absolute LLR (|LLR|) values associated with the respective information bits;

a CRC detector for performing error checking on the received frame using CRC bits for the decoded results, and outputting error checking results;

an LLR stop controller for requesting a stop to the iterative decoding, if a minimum value M(i) among the sequentially output absolute LLR (|LLR|) values is larger than a threshold determined based on a minimum value $F_{min}$ among absolute LLR (|LLR|) values output through previous iterative decoding and additionally is larger than a threshold determined based on a minimum value $I_{min}$ represented the minimum value among minimum absolute LLR (|LLR|) values that has satisfied the first stop condition in up to the previous decoding process for a currently decoded frame; and a stop selection controller for issuing a command to stop the iterative decoding being performed by the turbo decoder, based on the error checking results and in response to the stop request for the iterative decoding.

33. The apparatus as claimed in claim 32, wherein the threshold is determined by adding a preset adding factor $T_f$ to the minimum value $F_{min}$.

34. The apparatus as claimed in claim 32, wherein the LLR stop controller updates updating the minimum value $F_{min}$ with the minimum value M(i) if the minimum value M(i) is less than or equal to the threshold.

35. The apparatus as claimed in claim 32, wherein the stop selection controller issues a command to stop the iterative decoding if any of the error checking results and the stop request for the iterative decoding is provided.

* * * * *